United States Patent
Zanbaghi et al.

(10) Patent No.: US 11,500,406 B2
(45) Date of Patent: Nov. 15, 2022

(54) RATIOMETRIC CURRENT-MONITOR SENSE RESISTANCE MISMATCH EVALUATION AND CALIBRATION

(71) Applicant: CIRRUS LOGIC INTERNATIONAL SEMICONDUCTOR LTD., Edinburgh (GB)

(72) Inventors: Ramin Zanbaghi, Austin, TX (US); Eric Kimball, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/212,124

(22) Filed: Mar. 25, 2021

(65) Prior Publication Data

US 2022/0308613 A1      Sep. 29, 2022

(51) Int. Cl.
*H03F 3/217* (2006.01)
*H03F 1/32* (2006.01)
*G05F 1/59* (2006.01)

(52) U.S. Cl.
CPC .......... *G05F 1/59* (2013.01); *H03F 1/3205* (2013.01); *H03F 3/217* (2013.01); *H03F 3/2173* (2013.01)

(58) Field of Classification Search
CPC .......... G05F 1/59; H03F 1/3205; H03F 3/217; H03F 3/2173
USPC ........................................ 330/10, 251, 207 A
See application file for complete search history.

(56) References Cited

U.S. PATENT DOCUMENTS

| | | | |
|---|---|---|---|
| 10,206,037 B2* | 2/2019 | Chawla | H03F 3/2173 |
| 11,290,071 B2* | 3/2022 | Zanbaghi | H03F 1/38 |
| 2018/0309413 A1 | 10/2018 | D'Souza et al. | |
| 2019/0149107 A1 | 5/2019 | He et al. | |

OTHER PUBLICATIONS

U.S. Appl. No. 17/003,564, filed Aug. 26, 2020.
U.S. Appl. No. 17/331,525, filed May 26, 2021.

* cited by examiner

*Primary Examiner* — Hieu P Nguyen
(74) *Attorney, Agent, or Firm* — Mitch Harris, Atty at Law, LLC; Andrew M. Harris

(57) ABSTRACT

Current monitoring techniques are included in an electronic system that provides power to a load from a power output stage that supplies power to a load. Multiple current control devices form the power output stage in series with multiple sense resistors that provide corresponding sense voltages indicative of current provided through the multiple current control devices to the load in the same or different time intervals. A calibration control circuit controls injection of current through the multiple sense resistors individually and measures the corresponding sense voltages generated by the current to determine resistance values of the multiple sense resistors. A correction subsystem computes a first ratio of a first resistance to a second resistance and a second ratio of a third resistance to a fourth resistance of the multiple sense resistors, and controls compensation for a difference between the first ratio and the second ratio to remove the measurement error.

24 Claims, 8 Drawing Sheets

RATIOMETRIC CURRENT-MONITOR SENSE RESISTANCE MISMATCH EVALUATION AND CALIBRATION

BACKGROUND

1. Field of Disclosure

The field of representative embodiments of this disclosure relates to calibration of current monitors in electronic circuits, and in particular to a ratiometric method of correcting or compensating for mismatch in current-monitor resistors.

2. Background

Audio amplifiers, motor drivers, and other power output drivers, such as those for driving haptic feedback devices, commonly use sense resistors in series with the load and/or power supplies to determine the current supplied to the load. Very precise current measurement results can be obtained by including series sense resistors in each arm of an output structure such as an H-bridge, so that all of the current that is sourced to or received from a load is reflected in at least one of the sense resistor measurements.

However, any current measurement scheme employing sense resistors is only as accurate as the accuracy of the resistances of the resistors themselves, as error in the resistance of a sense resistor is reflected directly in the voltage that is produced as an indication of the sensed current. While the resistance value of each sense resistor may be measured and then used to calibrate the measurements in some manner, not all errors in sense resistor resistance values lead to corresponding errors in the measurement result, and therefore circuit-intensive and/or computation intensive calibration can be avoided for some cases.

Therefore, it would be advantageous to provide a method and system that evaluate sense resistor resistance error to determine the impact of sense resistor resistance error and to selectively calibrate a system to provide improved accuracy of the current measurements if needed.

SUMMARY

Improved current monitoring is accomplished in current monitoring systems, integrated circuits including the current monitoring system, and their methods of operation.

The current monitoring is included in an electronic system that provides power to a load from a power output stage. The electronic system includes multiple current control devices of the power output stage coupled to the load and multiple sense resistors coupled in series with corresponding ones of the multiple current control devices that provide corresponding sense voltages indicative of current provided through the multiple current control devices to the load in the same or different time intervals, a calibration control circuit that controls injection of current through the multiple sense resistors individually and measuring the corresponding sense voltages generated by the current, to determine resistance values of the multiple sense resistors, and a correction subsystem that computes a first ratio of a first resistance of a first one of the multiple resistances to a second resistance of a second one of the multiple sense resistors, computes a second ratio of a third resistance of a third one of the multiple sense resistors to a fourth resistance of a fourth one of the multiple sense resistors, and controls compensation for a difference between the first ratio and the second ratio to remove the measurement error.

In some embodiments, compensation is provided by adjusting at least one trim resistor coupled in series or parallel with a corresponding at least one of the multiple resistances to remove the measurement error. In other embodiments, not exclusive to adjusting resistance of the sense resistor, the compensation adjusts a measurement circuit that generates an indication of the measured current from multiple voltages across corresponding ones of the multiple resistances.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses circuits and integrated circuits that provide improved current monitoring accuracy and their methods of operation. The current monitoring may be included in an electronic system that provides power to a load from a power output stage. The electronic system may include multiple current control devices of the power output stage coupled to the load and multiple sense resistors coupled in series with corresponding ones of the multiple current control devices that provide corresponding sense voltages indicative of current provided through the multiple current control devices to the load in the same or different time intervals. Resistances of multiple sense resistors may be individually measured by injecting current through them and measuring the corresponding sense voltage. A correction subsystem then may compute a first ratio of a first resistance of a first one of the multiple resistances to a second resistance of a second one of the multiple sense resistors, compute a second ratio of a third resistance of a third one of the multiple sense resistors to a fourth resistance of a fourth one of the multiple sense resistors, and control compensation for a difference between the first ratio and the second ratio to remove the measurement error.

Figure 1:
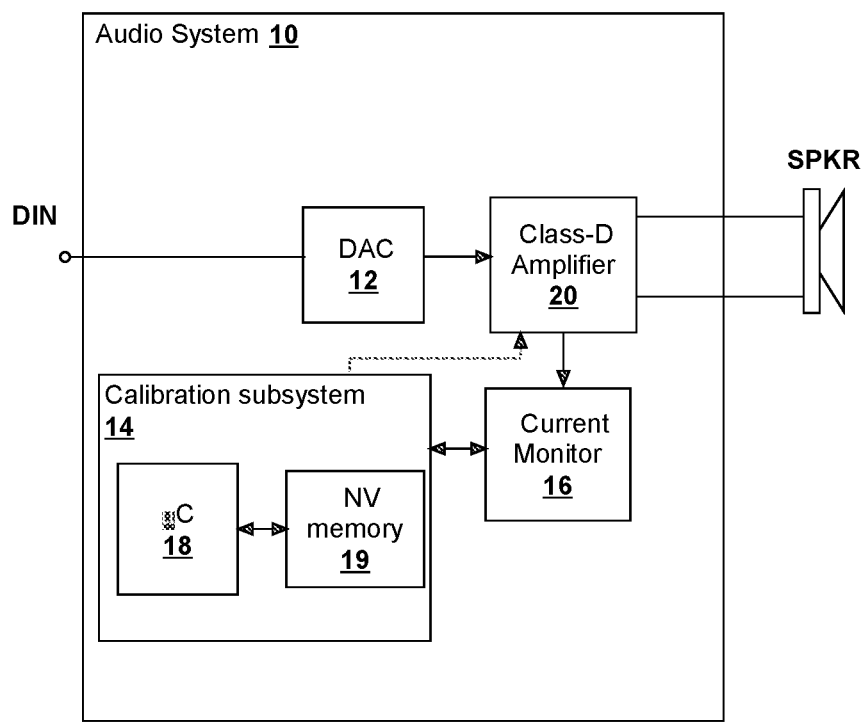
FIG. 1 is a block diagram showing an example audio system 10, in accordance with an embodiment of the disclosure.

Referring now to FIG. 1, an example audio system 10 is shown, in accordance with an embodiment of the disclosure. A digital audio input signal is received at input DIN and converted by a digital-to-analog converter (DAC) 12 to provide an input signal to a class-D amplifier 20 that provides a differential output pair of signals to a load, which in the instant example is a speaker SPKR, but may be, in other embodiments, a haptic device, a motor, or other device or transducer to which it is desired to supply pulse-width modulated (PWM) power output. A current monitor 16 is coupled to an output stage within class-D amplifier 20 and may provide a real-time dynamic measure of current delivered to speaker SPKR as will be described in further detail below. A calibration subsystem 14 may compensate for error in current sensing resistors within the output stage of class-D amplifier 20, either by adjusting circuits within current monitor 16, or values produced by current monitor 16, or by adjusting the sense resistors within the output stage of class-D amplifier 20. Calibration subsystem 14 includes a microcontroller (μC) core 18 and a non-volatile memory 19, for controlling the measurement and calibration of current monitor 16 and for storing program code and calibration/measurement values, respectively. In some embodiments of the disclosure, the sense resistor measurements are made off-line, e.g., at wafer or other pre-packaging test using probes, in which case the calibration subsystem only performs the calibration of current monitor 16 according to values stored in non-volatile memory 19. Alternatively, the decision-making and trimming of the current sensing circuits may all be performed prior to packaging, if the computed ratios indicate that correction is needed.

Figure 2:
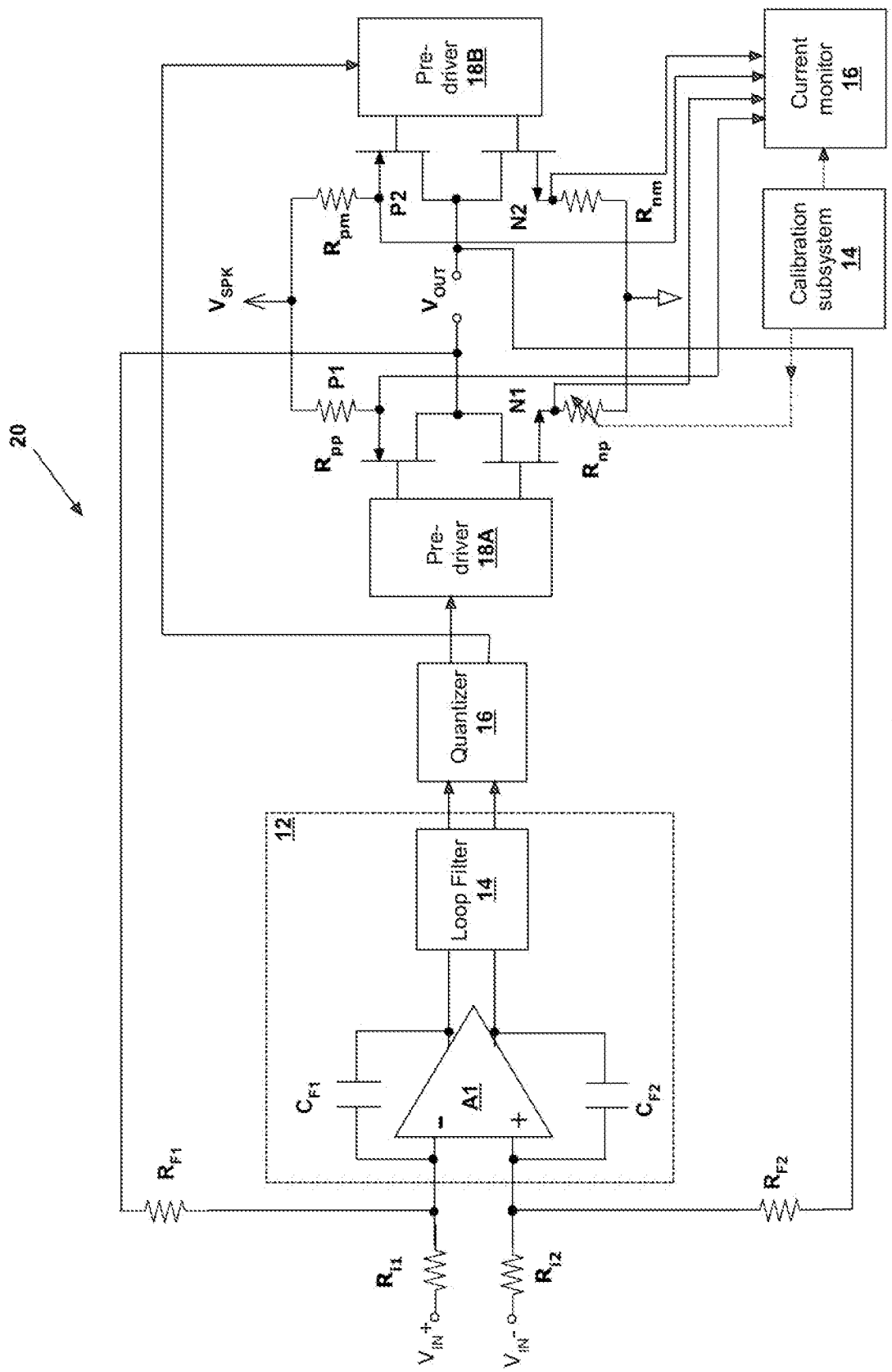
FIG. 2 is a simplified schematic diagram of an example class-D amplifier 20 of example audio system 10 of FIG. 1, in accordance with an embodiment of the disclosure.

Referring now to FIG. 2, a simplified schematic diagram of an example class-D amplifier 20 is shown, in accordance with an embodiment of the disclosure. An input amplifier A1 receives a differential pair of input signals $V_{IN+}$, $V_{IN-}$, e.g., from DAC 12 in audio subsystem 10 of FIG. 1 and feedback signals from a differential output $V_{OUT}$ of class-D amplifier 20. Input amplifier A1 forms an integrator with input resistors $R_{i1}$, $R_{i2}$, feedback resistors $R_{F1}$, $R_{F2}$ and local feedback capacitors $C_{F1}$, $C_{F2}$, and may provide a differential output to an input of a loop filter 14, which generates a differential output signal provided to the inputs of a quantizer 16. Quantizer 16 provides a differential output that is provided to pre-drivers 18A, 18B, which generate the drive signals for four transistors P1, P2, N1 and N2 that form the H-bridge output stage of class-D amplifier 20.

Current through each output current path of class-D amplifier 20, i.e., the current conducted through each of transistors P1, P2, N1 and N2 is sensed by corresponding current sense resistors $R_{pp}$, $R_{pm}$, $R_{np}$, and $R_{pm}$, by sensing a voltage across each of current sense resistors $R_{pp}$, $R_{pm}$, $R_{np}$, and $R_{pm}$ individually, as will be described in further detail below.

Error arises in the current measurements due to directly related error in the resistance values of current sense resistors $R_{pp}$, $R_{pm}$, $R_{np}$, and $R_{pm}$, which, when it is desirable to use current feedback, or otherwise handle the current measurements as a direct analog of the power delivered from the amplifier output stage, results in harmonic distortion. However, not all error in the resistance values of current sense resistors $R_{pp}$, $R_{pm}$, $R_{np}$, and $R_{pm}$ has an impact on the distortion of the measured current waveform. For the purpose of illustration, resistance $R_S$ is the ideal resistance of each of current sense resistors $R_{pp}$, $R_{pm}$, $R_{np}$, and $R_{pm}$ in the description below. For example, if the scaling errors $\partial R_{pp}$, $=R_{pp}/R_S-1$ and $\partial R_{pm}=R_{pm}/R_S-1$ in the resistance of high-side (positive power supply terminal $V_{SPK}$-connected) current sense resistors $R_{pp}$, $R_{pm}$ are the same, no harmonic distortion results. However, even if the scaling errors $\partial R_{pp}$, $\partial R_{np}$ in the resistance of the current sense resistors $R_{pp}$, $R_{np}$ are the same and the scaling errors $\partial R_{pm}$, $\partial R_{nm}$ are the same, but scaling errors $\partial R_{pp}$, $\partial R_{np}$ differ from scaling errors $\partial R_{pm}$, $\partial R_{nm}$, some harmonic distortion results. The worst-case (cross mismatch) error is produced when sense resistances on opposite sides of the H-bridge and connected to the opposite power supply rails are mismatched. Table I below shows values of signal to noise/distortion ratio for various combinations of scaling error in the resistance of current sense resistors $R_{pp}$, $R_{pm}$, $R_{np}$, and $R_{pm}$, illustrating the strong impact of cross-mismatch in the bottom row:

TABLE I

| Rsense Mismatch Configuraton | SNDR(dB) |
| --- | --- |
| $\partial R_{pp} = 0$, $\partial R_{pm} = 0$<br>$\partial R_{np} = 0$, $\partial R_{nm} = 0$ | 105 |
| $\partial R_{pp} = 0.2\%$, $\partial R_{pm} = 0.2\%$<br>$\partial R_{np} = 0$, $\partial R_{nm} = 0$ | 105 |
| $\partial R_{pp} = 0.2\%$, $\partial R_{pm} = 0$<br>$\partial R_{np} = 0.2\%$, $\partial R_{nm} = 0$ | 102 |
| $\partial R_{pp} = 0.2\%$, $\partial R_{pm} = 0$<br>$\partial R_{np} = 0$, $\partial R_{nm} = 0.2\%$ | 69 |

Ratios of the high-side and low-side sense resistances may be used to both evaluate the severity of the sense resistance errors and to perform compensation for errors and in alternative embodiments of the invention, ratios of the left-side and right-side sense resistances can be used. The high-side $\alpha_{high-side}$ and low-side $\alpha_{low-side}$ ratios are given by:

$$\alpha_{high-side} = \frac{R_{pp}}{R_{pm}} = \partial R_{pp} - \partial R_{pm}, \alpha_{low-side} = \frac{R_{np}}{R_{nm}} = \partial R_{np} - \partial R_{nm}$$

The high-side $\alpha_{high-side}$ and low-side $\alpha_{low-side}$ ratios are mis-matched, a single sense resistor, or the current monitoring circuit connected to that sense resistor, may be adjusted to match the high-side $\alpha_{high-side}$ and low-side $\alpha_{low-side}$ ratios, so that even though error may exist between the ideal resistance $R_S$ and the individual resistances of current sense resistors $R_{pp}$, $R_{pm}$, $R_{np}$, and $R_{pm}$, the error in the resulting current measurement will be within acceptable tolerance, or in some cases eliminated. For example, in a cross-mismatch condition, in which $\alpha_{high-side}=0.2\%$ and low-side $\alpha_{low-side}=-0.2\%$, the resistance $R_{np}$ of current sense resistor $R_{np}$ may be adjusted, or more practically, the gain of current monitor 16 with respect to the signal from current sense resistor $R_{np}$ may be adjusted by +0.4% so that $\alpha_{low-side}$ is now 0.2%. Since $\alpha_{high-side}$=low-side $\alpha_{low-side}=0.2\%$ after the adjustment, the error in the current measurement due to the cross-mismatch condition is thereby eliminated.

Calibration subsystem 14 is coupled to current sense resistors $R_{pp}$, $R_{pm}$, $R_{np}$, and $R_{pm}$ and is shown coupled alternatively to current monitor 16 to perform adjustment of the gain of current monitor 16 with respect to the signal provided from current sense resistor $R_{np}$, as illustrated in further detail below, or coupled directly to current sense resistor $R_{np}$ to perform the adjustment of current sense resistor $R_{np}$, generally by coupling one or more trim resistors in parallel with current sense resistor $R_{np}$ using MOS switches. While the above-described compensation scheme evaluates mis-match error in the high-side versus the low-side of the H-bridge, in an alternative embodiment, the ratios may be computed, evaluated and used to correct for mis-match error between the left side and the right side of the H-bridge in certain applications, by substituting $R_{np}$ for $R_{pm}$ and substituting $R_{nm}$ for $R_{pp}$ in the above ratio calculations, resulting in reduction or elimination of mis-match error between the two sides of the H-bridge. In another alternative, cross mis-match error may be reduced or eliminated by substituting $R_{nm}$ for $R_{pm}$ and substituting $R_{np}$ for $R_{pp}$ in the above ratio calculations.

Figure 3:
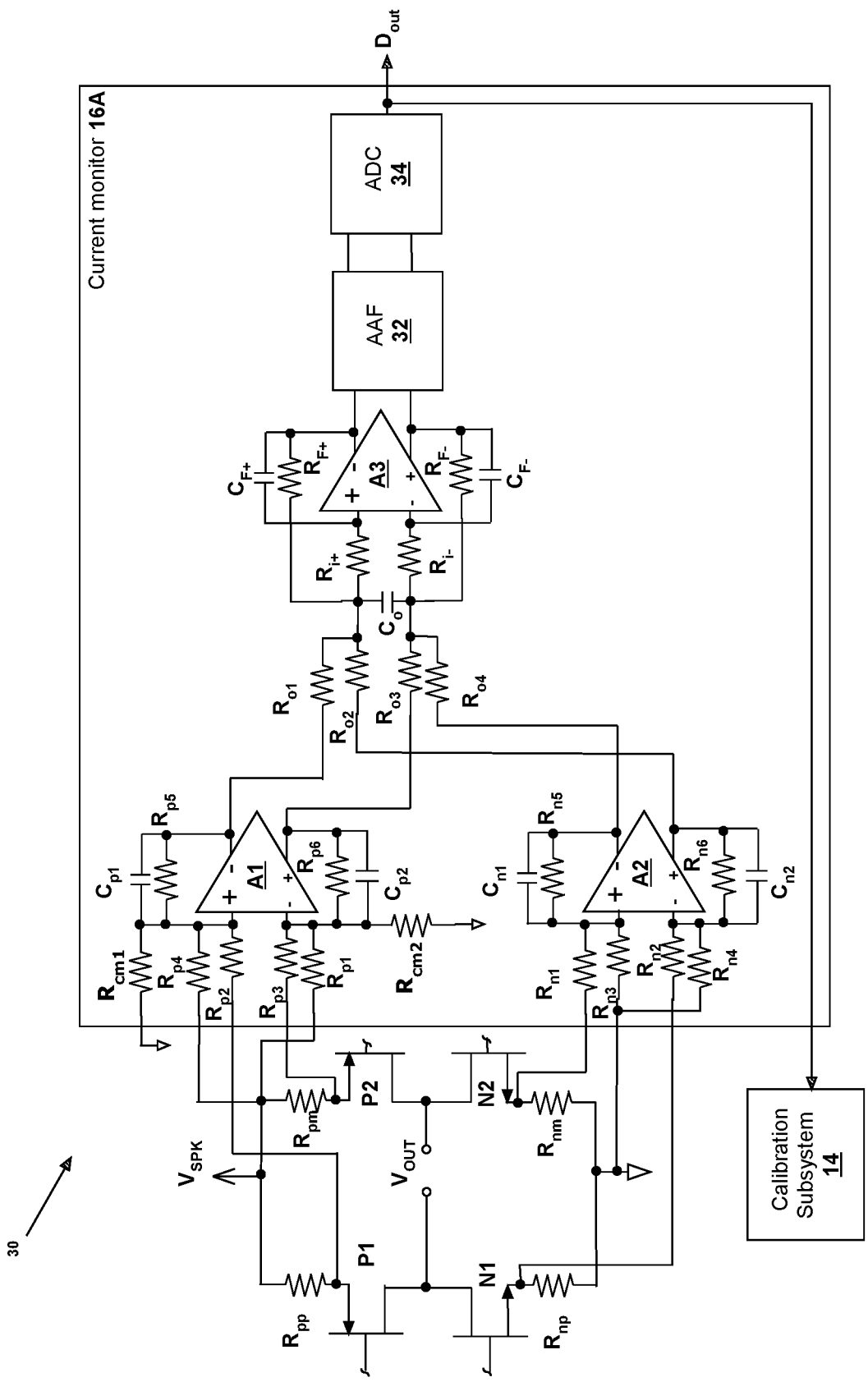
FIG. 3 is a simplified schematic diagram showing an example circuit 30, including an example current monitor 16A, coupled to an output stage of example class-D amplifier 20 of FIG. 2, in accordance with an embodiment of the disclosure.

Referring now to FIG. 3, a simplified schematic diagram of a circuit 30 including a current monitor 16A attached to the output driver of example class-D amplifier 20 is shown, in accordance with an embodiment of the disclosure. A pair of operational amplifiers A1, A2 are coupled to current sense resistors $R_{pp}$, $R_{pm}$, $R_{np}$, and $R_{pm}$ by corresponding input resistors $R_{p2}$, $R_{p1}$, $R_{n2}$, and $R_{n1}$. Additional input resistors $R_{p3}$, $R_{p4}$, $R_{n3}$, and $R_{n4}$ couple the opposite-polarity summing nodes of operational amplifiers A1, A2 to the power supply rails $V_{SPK}$ and ground in the example, so that the contribution from each of current sense resistors $R_{pp}$, $R_{pm}$, $R_{np}$, and $R_{pm}$ is differential with respect to the outputs of operational amplifiers A1, A2. Since only the pair of transistors P1 and N2 or the pair of transistors P2 and N1 will be conducting at any time, the current provided to the summing nodes of operational amplifiers A1,A2 is an analog of the total current provided through the load, since the current sense resistors on opposite sides of the H-bridge are coupled to opposite-polarity summing nodes of operational amplifiers A1,A2. Feedback resistors $R_{p5}$, $R_{n5}$ and feedback capacitors $C_{n1}$, $C_{n2}$ complete first-order low-pass filter around operational amplifiers A1,A2. An operational amplifier A3 receives the outputs of operational amplifiers A1,A2 in opposite polarity via input resistors $R_{o1}$, $R_{o1}$, $R_{o1}$, and $R_{o4}$ and implements a second-order low-pass filter that generates an output that is indicative of the net current delivered at output $V_{OUT}$. Resistors $R_{i+}$, $R_{i-}$, $R_{F+}$, and $R_{F-}$ along with capacitors $C_O$, $C_{F+}$ and $C_{F-}$ complete the feedback network around operational amplifier A3 that provides the second-order low-pass characteristic. An anti-aliasing filter (AAF) 32 followed by an analog-to-digital converter (ADC) 34 generate a digital output $D_{out}$ that represents the current delivered to the load. Calibration subsystem 14 receives digital output $D_{out}$ in order to perform the calibration/compensation for errors in the current measurements due to sense resistor error and other error as explained in further detail below.

Adjusting the resistance of current sense resistors $R_{pp}$, $R_{pm}$, $R_{np}$, and $R_{pm}$ may be complicated in implementations in which current sense resistors $R_{pp}$, $R_{pm}$, $R_{np}$, and $R_{pm}$ are external to an integrated circuit (IC) in which class-D amplifier 20 is incorporated, or generally because sense resistors $R_{pp}$ and $R_{pm}$ may be in a high-voltage domain. In order to calibrate current monitor 16A, rather than adjusting the resistance of current sense resistors $R_{pp}$, $R_{pm}$, $R_{np}$, and $R_{pm}$, in the depicted embodiment, the impedance of input resistors $R_{p1}$, $R_{p2}$, $R_{n1}$, and $R_{n2}$ is adjusted instead (by calibration subsystem 14), which alters the gain of current monitor 16A with respect to the voltage across corresponding current sense resistors $R_{pp}$, $R_{pm}$, $R_{np}$, and $R_{pm}$. Details of resistance adjustment are described in further detail below with respect to FIG. 6A and FIG. 6B, and control connections from calibration subsystem have been omitted for clarity. In general, because of the linear relationship between the current passing through current sense resistors $R_{pp}$, $R_{pm}$, $R_{np}$, and $R_{pm}$ the voltages across current sense resistors $R_{pp}$, $R_{pm}$, $R_{np}$, and $R_{pm}$ and the gain applied by current monitor 16A with respect to the voltages across current sense resistors $R_{pp}$, $R_{pm}$, $R_{np}$, and $R_{pm}$, the calibration adjustment of the resistance of current sense resistors $R_{pp}$, $R_{pm}$, $R_{np}$, and $R_{pm}$ may be an adjustment of the resistance of current sense resistors $R_{pp}$, $R_{pm}$, $R_{np}$, and $R_{pm}$, adjustment of the resistance of input resistors $R_{p1}$, $R_{p2}$, $R_{n1}$, and $R_{n2}$, or a combination of both. In the sense of this disclosure, at least in implementations in which the measurement of the resistance of current sense resistors $R_{pp}$, $R_{pm}$, $R_{np}$, and $R_{pm}$ is performed directly by current monitor 16A, the adjustment of any or all of the above compensates for the error in the resistance of both current sense resistors $R_{pp}$, $R_{pm}$, $R_{np}$, and $R_{pm}$, and input resistors $R_{p1}$, $R_{p2}$, $R_{n1}$, and $R_{n2}$, as well as compensating for any asymmetry between the gains at the inverting and non-inverting inputs of the amplifier implemented with operational amplifier A3, e.g., errors between the resistances of resistors $R_{i+}$ and $R_{i-}$, and resistances of resistors $R_{F+}$, and $R_{F-}$. While the above-described embodiment uses current monitor 16 with a single ADC 34, alternative embodiments may use separates ADC for the upper-half and lower-half of the H-bridge, or the left-half and right-half of the H-bridge in some applications, or an individual ADC may be used for each sense resistor, in which case the sense resistor ratios including any error in the measurement circuit gains may be computed directly on-line and the corrections may be applied to the digital values corresponding to the individual sense voltages. Similarly, if a separate ADC is used for the upper-half and lower-half of the H-bridge, or the left-half and right-half of the H-bridge, a compensation factor for the two halves of the H-bridge sense resistors may be applied to the outputs of the individual ADCs.

Figure 4:
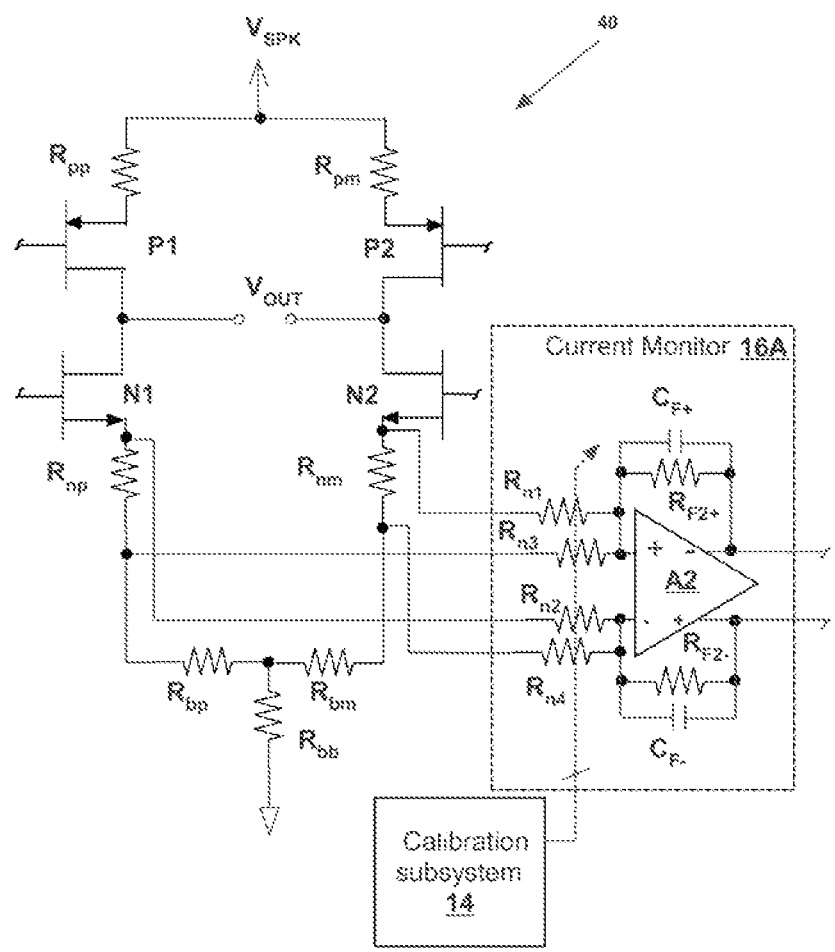
FIG. 4 is a simplified schematic diagram showing an example circuit 40 providing an example of a portion of example current monitor 16A, coupled to an example output stage of a class-D amplifier, in accordance with an embodiment of the disclosure.

Referring now to FIG. 4, another simplified schematic diagram of a circuit 40 is shown, including details of only the negative side portion of current monitor 16A attached to the output driver of example class-D amplifier 20. The high side portion of current monitor 16A as well as the stages after operational amplifiers A1 and A2 are omitted for clarity. The arrangement of inputs of current monitor 16A is advantageous as none of input resistors $R_{n1}$, $R_{n2}$, $R_{n3}$, and $R_{n4}$ are connected to the high-voltage domain at p-channel transistors P1 and P2, nor are input resistors $R_{n1}$, $R_{n2}$, $R_{n3}$, and $R_{n4}$ connected to ground, due to a biasing network formed by resistors $R_{bp}$, $R_{bm}$, and $R_{bb}$, avoiding the need to provide adjustment of resistances of resistors in the high-voltage domain. In the depicted circuit, the difference between the high-side sense resistance ratio and the low-side sense resistance ratio may be adjusted by adjusting the resistance of one or more of input resistors $R_{n1}$, $R_{n2}$, $R_{n3}$, and $R_{n4}$.

Figure 5:
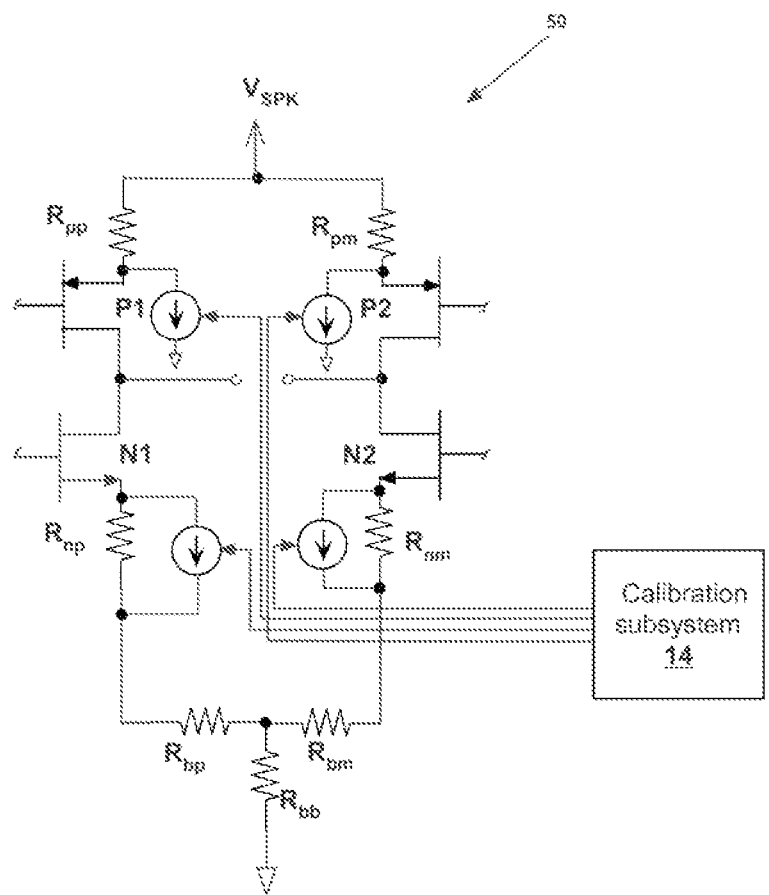
FIG. 5 is a simplified schematic diagram showing an example circuit 50 illustrating current injection for sense resistance measurement by calibration subsystem 14 that may be incorporated in example class-D amplifier 20 of FIG. 2, in accordance with an embodiment of the disclosure.

Referring now to FIG. 5, a simplified schematic diagram of an example circuit 50, illustrating current injection for performing the measurements described herein, is shown, in accordance with an embodiment of the disclosure. Calibration subsystem 14 provides control signals that activate and de-activate controllable current sources I1, I2, I3 and I4 individually, to generate sense voltages across current sense resistors $R_{pp}$, $R_{pm}$, $R_{np}$, and $R_{pm}$, so that the measurement output of the current monitor (not shown) will reflect only the contribution due to each of individual sense resistors $R_{pp}$, $R_{pm}$, $R_{np}$, and $R_{pm}$. Alternatively, a single current source may be provided, with switches controlling the application of current to the depicted nodes at each location of current sources I1, I2, I3 and I4.

Figure 6A:
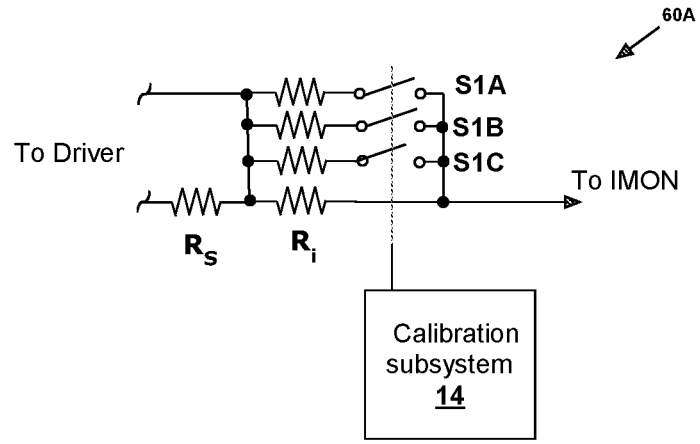
FIG. 6A is a simplified schematic diagram showing an example circuit 60A including an adjustable current measuring input resistor and FIG. 6B is a simplified schematic diagram showing an example circuit 60B including an adjustable sense resistor, as may be alternatively incorporated in example class-D amplifier 20 of FIG. 2, in accordance with embodiments of the disclosure.

Referring now to FIG. 6A, a simplified schematic diagram of an example circuit 60A including an adjustable current measuring input resistor is shown, in accordance with an embodiment of the disclosure. A plurality of switches S1A-S1C, in response to control signals provided by calibration subsystem 14 select one or more of tuning resistors $R_t$, which may form an R-2R ladder having the requisite resistances, which are inserted in parallel with current measuring input resistor $R_i$ in order to adjust the gain of current monitor 16 with respect to the individual one $R_S$ of current sense resistors $R_{pp}$, $R_{pm}$, $R_{np}$, or $R_p$. While the illustrated example shows trimming of input resistor $R_i$ with a selected one or more parallel tuning resistors $R_t$, in an alternative embodiment, a selected set of tuning resistors $R_t$ may instead be connected in series with input resistor $R_i$.

Figure 6B:
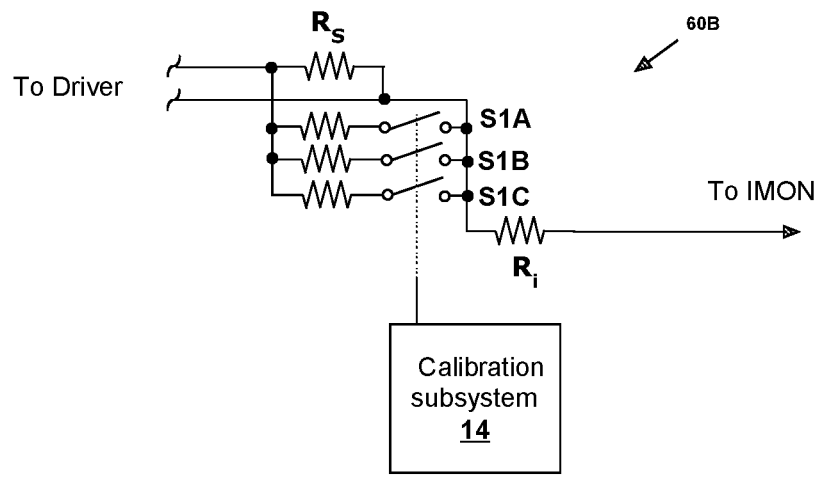

Referring now to FIG. 6B, a simplified schematic diagram of an example circuit 60B including an adjustable sense resistor is shown, in accordance with an embodiment of the disclosure. In the depicted embodiment, switches S1A-S1C, in response to control signals provided by calibration subsystem 14 select one or more of tuning resistors $R_t$, which may form an R-2R ladder having the requisite resistances, which are inserted in parallel with sense resistor $R_S$ in order to adjust the sensed voltage provided current monitor 16 by the individual one $R_S$ of sense resistors $R_{pp}$, $R_{pm}$, $R_{np}$, or $R_{pm}$, to which current measuring input resistor $R_i$ corresponds. While the illustrated example shows trimming of current sense resistor $R_S$ with a selected one or more parallel tuning resistors $R_t$, in an alternative embodiment, a selected set of tuning resistors $R_t$ may instead be connected in series with current sense resistors $R_S$.

Figure 7:
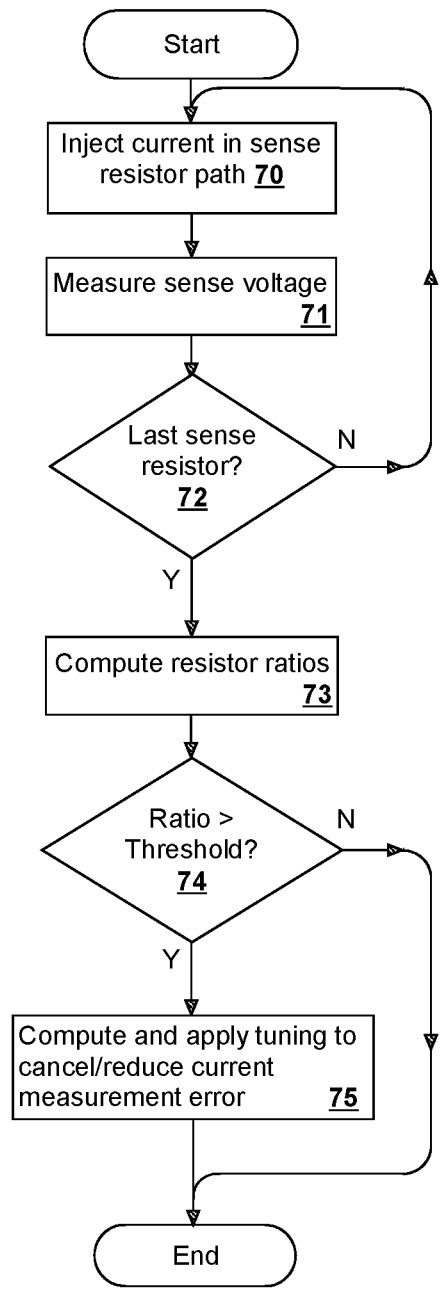
FIG. 7 is a flowchart illustrating an example calibration method in accordance with an embodiment of the disclosure.

Referring now to FIG. 7, a flowchart illustrating an example calibration method is shown, in accordance with an embodiment of the disclosure. First, current is injected in the current sense resistor path (step 70) and the sense voltage across the current sense resistor is measured and stored (step 71). Until the last sense resistor to be measured has been measured (decision 72), steps 70-72 are repeated. After the last sense resistor to be measured has been measured (decision 72), the resistor ratios described above are computed (step 73). If the ratio difference is greater than a threshold value (decision 74), the corrected resistance needed is computed and tuning is applied to cancel or reduce the measurement error (step 75) and the calibration ends (End). If the ratio difference is not greater than the threshold value (decision 74), then the corrected resistance is not computed, tuning is not applied, and the calibration ends (End).

Figure 8:
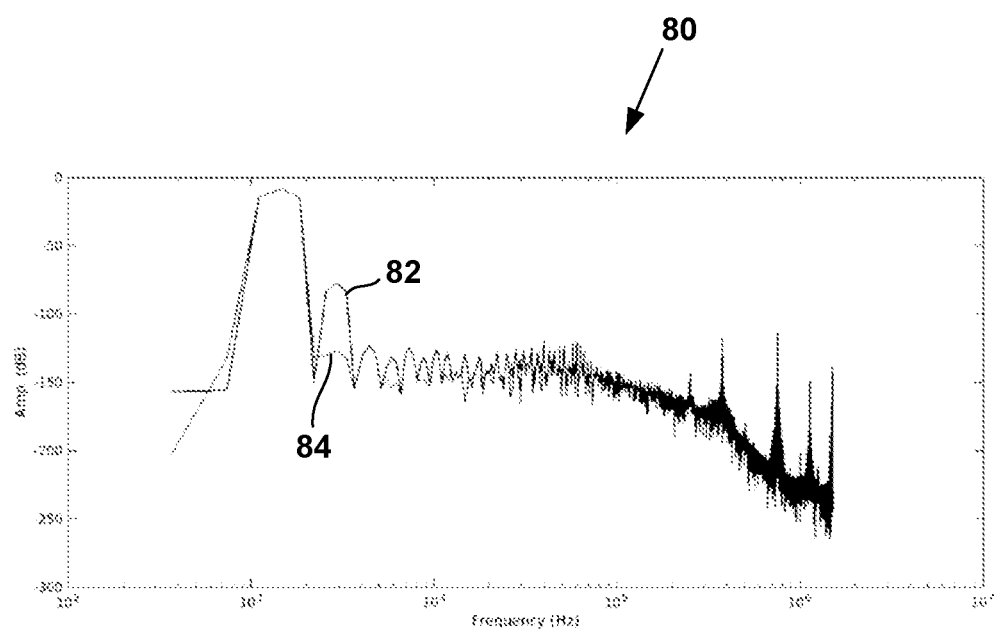
FIG. 8 is a graph depicting an example result of application of the method of FIG. 7 applied in audio system 10 of FIG. 1, in accordance with an embodiment of the disclosure.

Referring now to FIG. 8, a graph 80 illustrating results of calibration in accordance with an embodiment of the disclosure is shown. The fundamental responses of pre- and post-calibration are matched, but starting with the second harmonic of, e.g., a sinusoidal input test tone, the second harmonic peak 84 of the calibrated amplifier may be seen as approximately −50 dB with respect to the second harmonic peak 82 of the uncalibrated amplifier, along with other visible reductions in the even harmonic distortion energy above second harmonic peak 82. A distortion analysis may be performed analytically, using each output state and computing the voltage across a corresponding one of the output transistors of class-D amplifier 20 for a load current $I_L$, illustrated in Table II below. Using the output state definitions and output voltages, the total sensed voltage including gain and resistor mismatches is given by:

$$V_{SNS} = 2I_L R_S + I_L \frac{\Delta R_{NP}}{2}[P^2 - N^2] + \frac{\alpha}{2}[2I_L R_S(1 - [P+N]) + I_L \Delta R(P^2 - N^2)]$$

and the low-side to high-side mismatch is $\Delta R_{NP} = \Delta R_N - \Delta R_P = (R_{nm} - R_{np}) - (R_{pm} - R_p)$ where $$\Delta R = \frac{\Delta R_N + \Delta R_P}{2}.$$

TABLE II

| Output State | $V_{np}$ | $V_{N2}$ | $V_{P1}$ | $V_{P2}$ |
| --- | --- | --- | --- | --- |
| P high, N low | 0 | $I_L R_{nm}$ | $-I_L R_{pp}$ | 0 |
| P low, N high | $-I_L R_{np}$ | 0 | 0 | $I_L R_{pm}$ |
| Both high | 0 | 0 | $-I_L R_{pp}$ | $I_L R_{pm}$ |
| Both low | $-I_L R_{np}$ | $I_L R_{nm}$ | 0 | 0 |

In order to evaluate the distortion effects of the above, analytic representations of signals for both P and N may be derived from a Fourier series expansion, in which the first term is the undistorted input signal a(t), and the remainder of the terms are harmonic distortion components:

$$P - N = a(t) + \sum_{n=1}^{\infty} \frac{4}{\pi n} \cos(\omega_0 n t) \, \cos\left(n\frac{\pi}{2}\right) \sin\left(n\frac{\pi}{2}a(t)\right)$$

normalizing the signal as a gain, the following expression is obtained:

$$P + N = 1 + \sum_{n=1}^{\infty} \frac{4}{\pi n} \cos(\omega_0 n t) \, \sin\left(n\frac{\pi}{2}\right) \cos\left(n\frac{\pi}{2}a(t)\right) V_{SNS} =$$

$$2I_L R_S + I_L \frac{\Delta R_{NP}}{2}[P^2 - N^2] + \frac{\alpha}{2}[2I_L R_S(1 - [P+N]) + I_L \Delta R(P^2 - N^2)]$$

The first term again is due to the undistorted input signal, but the second term, which is the second harmonic component may be simplified using the definition of P-N and is the square of input signal a(t). The third term, when a component corresponding to the fundamental of input signal a(t) is subtracted has only high-frequency components remaining. The fourth term is proportional to $\Delta R$, which yields only two small resistor mis-match terms that are negligible. Thus, the gain and sense resistor mismatch terms do not introduce energy mismatch terms between the current circulating and current flowing phases of the class-D amplifier output stage and do not introduce signal third harmonics. The second harmonic distortion component arises from the difference $(R_{nm} - R_{np}) - (R_{pm} - R_p)$, which is reduced or eliminated according to the above-described calibration procedure and averaging using the four resistor current sensing scheme reduces this component further due to averaging over implementations using only two current sense resistors.

In summary, this disclosure shows and describes systems and integrated circuits including the systems, and their methods of operation. The system may be an electronic system for providing power to a load from a power output stage. The system may include multiple current control devices of the power output stage coupled to the load, multiple sense resistors coupled in series with corresponding ones of the multiple current control devices for providing corresponding sense voltages indicative of current provided through the multiple current control devices to the load in the same or different time intervals, a calibration control circuit for controlling injection of current through the multiple sense resistors individually and measuring the corresponding sense voltages generated by the current, to determine resistance values of the multiple sense resistors, and a correction subsystem for computing a first ratio of a first resistance of a first one of the multiple resistances to a second resistance of a second one of the multiple sense resistors, computing a second ratio of a third resistance of a third one of the multiple sense resistors to a fourth resistance of a fourth one of the multiple sense resistors, and controlling compensation for a difference between the first ratio and the second ratio to remove the measurement error.

In some example embodiments, the correction subsystem may control the compensation by adjusting at least one trim resistor coupled in series or parallel with a corresponding at least one of the multiple sense resistors to remove the measurement error. In some example embodiments, the correction subsystem may control the compensation by adjusting a measurement circuit that generates an indication of the measured current from multiple voltages across corresponding ones of the multiple resistors. In some example embodiments, correction subsystem may control the compensation by trimming input resistors of an analog summing amplifier that generates an analog input to the current measuring subsystem. In some example embodiments, the correction subsystem may control the compensation by adjusting digital values produced by the current measuring subsystem. In some example embodiments, the correction subsystem may compare the first ratio to the second ratio and control the compensation by only performing the compensation if the magnitude of the ratio differs from unity by a predetermined amount. In some example embodiments, the correction subsystem may compare the first ratio to the second ratio and selectively sets a compensation factor of the compensation to zero if the first ratio and the second ration are substantially equal. In some example embodiments, the multiple current control devices may be transistors that form an H-bridge configuration, wherein the first one of the multiple resistors couples a first one of the multiple transistors to a positive power supply rail, wherein the second one of the multiple resistors couples a second one of the multiple transistors to the positive power supply rail, wherein the third one of the multiple resistors couples a third transistor to a negative power supply rail, and wherein the fourth one of the multiple resistors couples a fourth transistor to the negative power supply rail, whereby the compensation subsystem may compensate for differences in sense voltages that produce measurement error with respect to current sourced from the positive power supply rail and current provided to the negative power supply rail. In some example embodiments, the H-Bridge may be an output stage of a class-D amplifier. In some example embodiments, the multiple current control devices may transistors that form an H-bridge configuration, wherein the first one of the multiple resistors couples a first one of the multiple transistors to a positive power supply rail, wherein the second one of the multiple resistors couples a second transistor to a negative power supply rail, wherein the third one of the multiple resistors couples a third transistor to the positive power supply rail, and wherein the fourth one of the multiple resistors couples a fourth transistor to the negative power supply rail. The compensating may compensate for differences in sense voltages that produce measurement error with respect to current sourced from an output side of the H-bridge and current sourced by a second output of the H-bridge.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in an IC that provides current to a motor or haptic device.

What is claimed is:

1. A method of removing measurement error due to resistance variation in a current measuring subsystem of an electronic device that provides power to a load and that uses multiple resistances in each of multiple corresponding current paths under measurement to measure current, wherein the multiple current paths conduct current to the load in the same or different time intervals, the method comprising:
    injecting current through the multiple resistances individually and measuring voltages generated by the current, to determine resistance values of the multiple resistances;
    computing a first ratio of a first resistance of a first one of the multiple resistances to a second resistance of a second one of the multiple resistances;
    computing a second ratio of a third resistance of a third one of the multiple resistances to a fourth resistance of a fourth one of the multiple resistances; and
    compensating for a difference between the first ratio and the second ratio to remove the measurement error.

2. The method of claim 1, wherein the compensating adjusts at least one trim resistor coupled in series or parallel with a corresponding at least one of the multiple resistances to remove the measurement error.

3. The method of claim 1, wherein the compensating adjusts a measurement circuit that generates an indication of the measured current from multiple voltages across corresponding ones of the multiple resistances.

4. The method of claim 3, wherein the compensating adjusts the measurement circuit by trimming input resistors of an analog summing amplifier that generates an analog input to the current measuring subsystem.

5. The method of claim 3, wherein the compensating adjusts digital values produced by the current measuring subsystem.

6. The method of claim 1, further comprising:
    determining, by comparing the first ratio to the second ratio, whether or not to remove the measurement error;
    responsive to determining not to remove the measurement error, not performing the compensating; and
    responsive to determining to remove the measurement error, performing the compensating.

7. The method of claim 1, further comprising:
    comparing the first ratio to the second ratio; and
    selectively setting a compensation factor of the compensating to zero responsive to the comparing determining that the first ratio and the second ratio are substantially equal.

8. The method of claim 1, wherein each of the multiple resistances is connected in series with a corresponding one of multiple current control devices and the load.

9. The method of claim 8, wherein the multiple current control devices are transistors that form an H-bridge configuration, wherein the multiple resistances are multiple resistors, wherein a first one of the multiple resistors couples a first one of the multiple transistors to a positive power supply rail, wherein the second one of the multiple resistors couples a second one of the multiple transistors to the positive power supply rail, wherein a third one of the multiple resistors couples a third one of the multiple transistors to a negative power supply rail, and wherein a fourth one of the multiple resistors couples a fourth one of the multiple transistors to the negative power supply rail, whereby the compensating compensates for differences in sense voltages that produce measurement error with respect to current sourced from the positive power supply rail and current provided to the negative power supply rail.

10. The method of claim 9, wherein the H-bridge is an output stage of a class-D amplifier.

11. The method of claim 8, wherein the multiple current control devices are transistors that form an H-bridge configuration, wherein the multiple resistances are multiple resistors, wherein a first one of the multiple resistors couples a first one of the multiple transistors to a positive power supply rail, wherein a second one of the multiple resistors couples a second one of the multiple transistors to a negative power supply rail, wherein a third one of the multiple resistors couples a third one of the multiple transistors to the positive power supply rail, and wherein a fourth one of the multiple resistors couples a fourth one of the multiple transistors to the negative power supply rail, whereby the compensating compensates for differences in sense voltages that produce measurement error with respect to current sourced from an output side of the H-bridge and current sourced by a second output of the H-bridge.

12. The method of claim 11, wherein the H-bridge is an output stage of a class-D amplifier.

13. An electronic system for providing power to a load from a power output stage, comprising:
- multiple current control devices of the power output stage coupled to the load;
- multiple sense resistors coupled in series with corresponding ones of the multiple current control devices for providing corresponding sense voltages indicative of current provided through the multiple current control devices to the load in the same or different time intervals;
- a calibration control circuit for controlling injection of current through the multiple sense resistors individually and measuring the corresponding sense voltages generated by the current, to determine resistance values of the multiple sense resistors; and
- a correction subsystem for computing a first ratio of a first resistance of a first one of the multiple resistances to a second resistance of a second one of the multiple sense resistors, computing a second ratio of a third resistance of a third one of the multiple sense resistors to a fourth resistance of a fourth one of the multiple sense resistors, and controlling compensation for a difference between the first ratio and the second ratio to remove the measurement error.

14. The electronic system of claim 13, wherein the correction subsystem controls the compensation by adjusting at least one trim resistor coupled in series or parallel with a corresponding at least one of the multiple sense resistors to remove the measurement error.

15. The electronic system of claim 13, wherein the correction subsystem controls the compensation by adjusting a measurement circuit that generates an indication of the measured current from multiple voltages across corresponding ones of the multiple resistors.

16. The electronic system of method of claim 15, wherein the correction subsystem controls the compensation by trimming input resistors of an analog summing amplifier that generates an analog input to the current measuring subsystem.

17. The electronic system of claim 15, wherein the correction subsystem controls the compensation by adjusting digital values produced by the current measuring subsystem.

18. The electronic system of claim 13, wherein the correction subsystem compares the first ratio to the second ratio and controls the compensation by only performing the compensation if the magnitude of the ratio differs from unity by a predetermined amount.

19. The electronic system of claim 13, wherein the correction subsystem compares the first ratio to the second ratio and selectively sets a compensation factor of the compensation to zero if the first ratio and the second ration are substantially equal.

20. The electronic system of claim 13, wherein the multiple current control devices are transistors that form an H-bridge configuration, wherein the first one of the multiple resistors couples a first one of the multiple transistors to a positive power supply rail, wherein the second one of the multiple resistors couples a second one of the multiple transistors to the positive power supply rail, wherein the third one of the multiple resistors couples a third transistor to a negative power supply rail, and wherein the fourth one of the multiple resistors couples a fourth transistor to the negative power supply rail, whereby the compensation subsystem compensates for differences in sense voltages that produce measurement error with respect to current sourced from the positive power supply rail and current provided to the negative power supply rail.

21. The electronic system of claim 20, wherein the H-Bridge is an output stage of a class-D amplifier.

22. The electronic system of claim 20, wherein the multiple current control devices are transistors that form an H-bridge configuration, wherein the first one of the multiple resistors couples a first one of the multiple transistors to a positive power supply rail, wherein the second one of the multiple resistors couples a second transistor to a negative power supply rail, wherein the third one of the multiple resistors couples a third transistor to the positive power supply rail, and wherein the fourth one of the multiple resistors couples a fourth transistor to the negative power supply rail, whereby the compensating compensates for differences in sense voltages that produce measurement error with respect to current sourced from an output side of the H-bridge and current sourced by a second output of the H-bridge.

23. The electronic system of claim 22, wherein the H-bridge is an output stage of a class-D amplifier.

24. An amplifier for providing power to a load, comprising:
- a power output stage having a first transistor coupled to a first terminal of the load, a first resistor that couples the first transistor to a positive power supply rail, a second transistor coupled to a second terminal of the load, a second resistor that couples the second transistor to the positive power supply rail, a third transistor coupled to the first terminal of the load, a third resistor that couples the third transistor to a negative power supply rail, a fourth transistor coupled to the second terminal of the load, and fourth resistor that couples the second transistor to the negative power supply rail;

a calibration control circuit for controlling injection of current through the first resistor, the second resistor, the third resistor and the fourth resistor individually and measuring corresponding sense voltages generated by the current across the through the first resistor, the second resistor, the third resistor and the fourth resistor to determine resistances of first resistor, the second resistor, the third resistor and the fourth resistor; and a correction subsystem for computing a first ratio of the resistance of the first resistor to the resistance of the second resistor, computing a second ratio of the resistance of the third resistor to the resistance of the fourth resistor, and controlling compensation for a difference between the first ratio and the second ratio to remove the measurement error.

* * * * *

UNITED STATES PATENT AND TRADEMARK OFFICE
CERTIFICATE OF CORRECTION

PATENT NO. : 11,500,406 B2
APPLICATION NO. : 17/212124
DATED : November 15, 2022
INVENTOR(S) : Zanbaghi et al.

Page 1 of 2

It is certified that error appears in the above-identified patent and that said Letters Patent is hereby corrected as shown below:

In the Specification

In Column 3, Line 64, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 3, Line 66, delete "$R_{pm}$," and insert -- $R_{nm}$, --, therefor.

In Column 4, Line 3, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 4, Line 8, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 4, Line 11, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 4, Line 12, delete "$\partial R_{pp}$," and insert -- $\partial R_{pp}$ --, therefor.

In Column 4, Line 27, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 4, TABLE 1, Line 1, delete "Configuraton" and insert -- Configuration --, therefor.

In Column 4, Line 59, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 5, Line 29, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 5, Line 35, delete "$R_{pm}$," and insert -- $R_{nm}$, --, therefor.

In Column 5, Line 47, delete "$R_{o1}$, $R_{o1}$, $R_{o1}$, and $R_{o4}$" and insert -- $R_{o1}$, $R_{o2}$, $R_{o3}$, and $R_{o4}$ --, therefor.

In Column 5, Line 61, delete "$R_{pm}$, $R_{np}$, and $R_{pm}$," and insert -- $R_{pm}$, $R_{np}$, and $R_{nm}$, --, therefor.

In Column 5, Line 62, delete "$R_{pp}$, $R_{pm}$, $R_{np}$, and $R_{pm}$," and insert -- $R_{pp}$, $R_{pm}$, $R_{np}$, and $R_{nm}$, --, therefor.

Signed and Sealed this
Twenty-eighth Day of March, 2023

Katherine Kelly Vidal
*Director of the United States Patent and Trademark Office*

CERTIFICATE OF CORRECTION (continued)
U.S. Pat. No. 11,500,406 B2

In Column 6, Line 1, delete "$R_{pm}$," and insert -- $R_{nm}$, --, therefor.

In Column 6, Line 5, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 6, Line 11, delete "$R_{pm}$," and insert -- $R_{nm}$, --, therefor.

In Column 6, Line 12, delete "$R_{pm}$, $R_{np}$, and $R_{pm}$," and insert -- $R_{pm}$, $R_{np}$, and $R_{nm}$, --, therefor.

In Column 6, Line 14, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 6, Line 16, delete "$R_{pm}$," and insert -- $R_{nm}$, --, therefor.

In Column 6, Line 17, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 6, Line 21, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 6, Line 25, delete "$R_{pm}$," and insert -- $R_{nm}$, --, therefor.

In Column 7, Line 3, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 7, Line 6, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 7, Line 20, delete "$R_{pp}$, $R_{pm}$, $R_{np}$, and $R_{pm}$," and insert -- $R_{pp}$, $R_{pm}$, $R_{np}$, and $R_{nm}$, --, therefor.

In Column 7, Line 35, delete "$R_{pm}$," and insert -- $R_{nm}$, --, therefor.

In Column 9, Line 47, delete "ration" and insert -- ratio --, therefor.